United States Patent
Gore et al.

(10) Patent No.: US 8,910,824 B2
(45) Date of Patent: Dec. 16, 2014

(54) ANNULAR ENCLOSURE PROVIDED WITH AN ARRANGEMENT OF RECESSES OR PROTRUSIONS TO REDUCE MECHANICAL RESONANCE

(75) Inventors: Russell Peter Gore, Abingdon (GB); Trevor Bryan Husband, Banbury (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 1485 days.

(21) Appl. No.: 11/797,487

(22) Filed: May 3, 2007

(65) Prior Publication Data

US 2007/0257042 A1    Nov. 8, 2007

(30) Foreign Application Priority Data

May 6, 2006 (GB) ................................ 0609034.4

(51) Int. Cl.

| | | |
|---|---|---|
| F17C 1/00 | (2006.01) | |
| F17C 13/06 | (2006.01) | |
| G01R 33/28 | (2006.01) | |
| G01R 33/3815 | (2006.01) | |
| G01R 33/565 | (2006.01) | |
| H01F 6/00 | (2006.01) | |

(52) U.S. Cl.
CPC .............. *F17C 13/06* (2013.01); *G01R 33/288* (2013.01); *G01R 33/56509* (2013.01); *G01R 33/3815* (2013.01); *F17C 2209/234* (2013.01); *H01F 6/00* (2013.01); *F17C 2270/0527* (2013.01); *F17C 2203/0619* (2013.01)
USPC ................. 220/560.06; 220/560.03

(58) Field of Classification Search
USPC ......... 220/560.03, 560.1, 91, 560.06, 560.09, 220/560.11, 560.12, 608, 609, 623, 624, 220/628, 560.13, 901; 62/51.1; 68/58
See application file for complete search history.

(56) References Cited

U.S. PATENT DOCUMENTS

| | | | | |
|---|---|---|---|---|
| 2,264,307 | A | * | 12/1941 | Haberstump ..................... 68/58 |
| 3,221,916 | A | * | 12/1965 | Rysgaard ................... 220/560.06 |
| 4,037,751 | A | * | 7/1977 | Miller et al. .................. 428/593 |
| 4,176,761 | A | | 12/1979 | Gobl |
| 4,502,296 | A | * | 3/1985 | Ogata et al. ..................... 62/51.1 |
| 4,694,663 | A | * | 9/1987 | Miller ............................. 62/51.1 |
| 4,716,513 | A | | 12/1987 | Ito |
| 4,848,103 | A | * | 7/1989 | Pelc et al. ....................... 62/51.1 |
| 5,020,358 | A | | 6/1991 | Sharp |
| 5,025,645 | A | * | 6/1991 | Eck et al. ......................... 68/27 |

(Continued)

FOREIGN PATENT DOCUMENTS

| | | |
|---|---|---|
| DE | 100 49 766 A1 | 4/2002 |
| JP | 59-182511 A | 10/1984 |
| JP | 1-208817 A | 8/1989 |
| JP | 2001-315889 A | 11/2001 |

OTHER PUBLICATIONS

European Office Action dated Nov. 20, 2008.
Great Britain Search Report dated Sep. 6, 2006 (One (1) page).

*Primary Examiner* — Jeffrey Allen
(74) *Attorney, Agent, or Firm* — Crowell & Moring LLP

(57) ABSTRACT

A hollow cylindrical vessel comprising a cylindrical outer shell (12) and a cylindrical inner shell (14) joined by annular end caps (16), wherein at least one of: an end cap, or the cylindrical outer shell (12), or the cylindrical inner shell (14), is provided with an arrangement of recesses or protrusions (18). Preferably, the arrangement of recesses or protrusions is asymmetrical in all axes.

19 Claims, 5 Drawing Sheets

(56) References Cited

U.S. PATENT DOCUMENTS

| | | |
|---|---|---|
| 5,235,283 A | 8/1993 | Lehne et al. |
| 5,385,026 A * | 1/1995 | Zhang et al. ............... 62/50.7 |
| 5,462,191 A | 10/1995 | Bartlow et al. |
| 5,542,255 A * | 8/1996 | Preston et al. ............... 62/45.1 |
| 5,794,670 A * | 8/1998 | LaFleur ...................... 141/314 |
| 6,227,396 B1 * | 5/2001 | Small ......................... 220/4.12 |
| 6,691,521 B2 | 2/2004 | Huber et al. |

* cited by examiner

ANNULAR ENCLOSURE PROVIDED WITH AN ARRANGEMENT OF RECESSES OR PROTRUSIONS TO REDUCE MECHANICAL RESONANCE

The present invention relates to the construction of vacuum containers for equipment such as cryogenically cooled magnets for magnetic resonance imaging (MRI) systems.

As is known by those skilled in the art, an MRI system typically comprises a solenoidal superconducting magnet which is cooled to a temperature below the critical temperature of the superconducting material used. Typically, such magnets are cooled to a temperature of about 4.2K, the boiling point of helium. In order to maintain such equipment at such low temperatures, it is necessary to effectively thermally insulate the cooled equipment from ambient temperature. This is typically done by enclosing the equipment within an outer vacuum chamber (OVC) which is evacuated to a hard vacuum, and preferably also by interposing thermal shields between the cooled equipment and the OVC. The OVC is typically at approximately ambient temperature, with the shield(s) being at intermediate temperature(s).

The OVC has to support atmospheric pressure on its outer surface with a hard vacuum on its inner surface. The OVC must accordingly be made very strong to resist the forces applied to it by atmospheric pressure. The OVC for a solenoidal magnet structure typically comprises an outer cylinder, of diameter greater than the maximum diameter of the magnet; an inner cylinder of diameter less than the inner diameter of the magnet, and annular end caps, configured to join the outer and inner cylinders to form an annular enclosure for the magnet.

Known end caps for OVC vessels suitable for housing superconducting magnets used in whole-body MRI equipment typically have a circular outside diameter in the region of 2000 mm and a concentric inner diameter of about 850-900 mm. approx. The material of their construction is typically of constant thickness. The end caps typically feature full rotational symmetry, largely as a function of the manufacturing process. The geometry of the end caps may be "flat", "partially flat", such as part cone part flat, or "dished", forming a concave or convex surface to the ends of the OVC, such that the external atmospheric pressure is more efficiently supported by the end cap rather than simply by the resistance to bending of the material itself.

A side-effect of the symmetry observed in end caps of the prior art is to encourage the system to respond in a resonant fashion in response to vibrational excitation. This may prove troublesome in applications such as MRI systems. The gradient coil set, used to generate varying magnetic fields in the imaging process, may cause vibration of the MRI system of a frequency suitable to set up resonance in the end caps. Other sources of potentially troublesome vibrations from within the MRI system include mechanical vibration from a cryogenic refrigerator, such as may be caused by the motion of cold head displacer movement. External vibrations may also prove troublesome, such as floor borne vibrations or acoustic noise.

Effects of resonant vibration in the end caps may manifest themselves in increased acoustic noise, caused by the end cap acting as an amplifying surface, similar to the action of a loudspeaker cone. Alternatively, the resonance of the end caps may result in amplification of the applied mechanical vibration to such an extent that increased image distortion results. As is typical in resonant systems, these effects will be particularly strong for applied vibrations at, or close to, the natural frequencies of the vibration modes of the end caps.

Furthermore, the symmetry and geometrical uniformity of the typical end cap enables efficient transmission of vibrational energy to other parts of the structure at which resonance may be excited, despite such vibrations being at a frequency different from the resonant modes of the end cap.

There is potential correlation therefore, between the simple geometry of the magnet end caps—with their well defined resonant modes—and system performance in respect of image quality and acoustic noise.

The present invention therefore seeks to reduce the sensitivity of enclosures such as the OVC of a solenoidal magnet for use in an MRI system to applied mechanical vibration to reduce the detrimental effects of the sensitivity of such enclosures to vibrations, some of which are described above.

Furthermore, the above-described known end caps are relatively insensitive to known anti-vibration and noise reduction techniques, due to the large thickness and mass of the materials used. The present invention provides end caps constructed of much thinner and lighter materials, enabling a significant benefit to be obtained through the use of known anti-vibration and noise reduction techniques.

The present invention accordingly provides methods and/or apparatus as defined in the appended claims.

The above, and further, objects, characteristics and advantages of the present invention will be further described with reference to certain embodiments, given by way of examples only, in the following description in conjunction with the accompanying drawings, wherein.

Figure 5A:
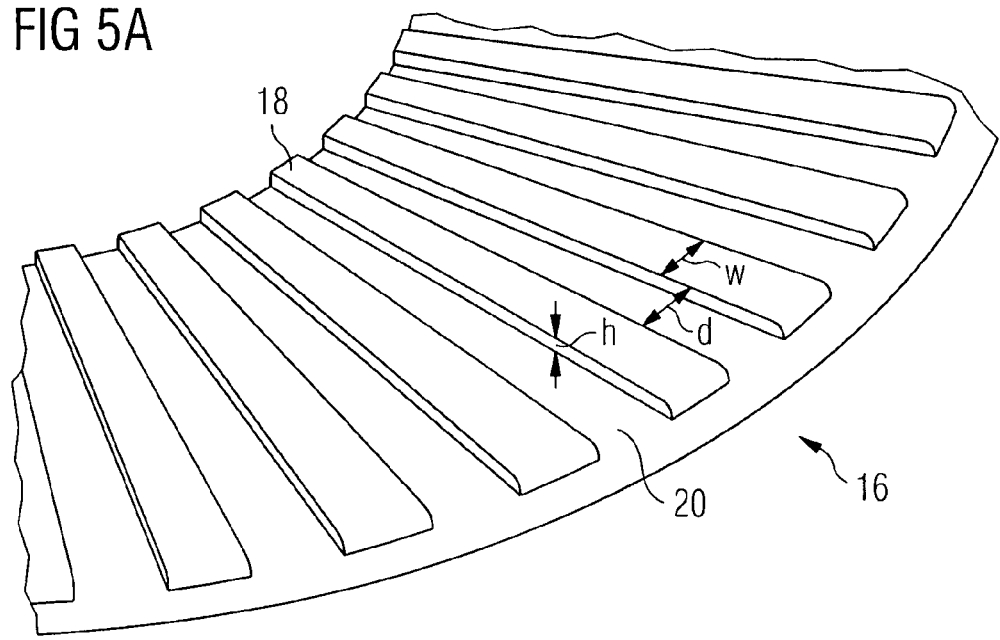
Figure 5B:
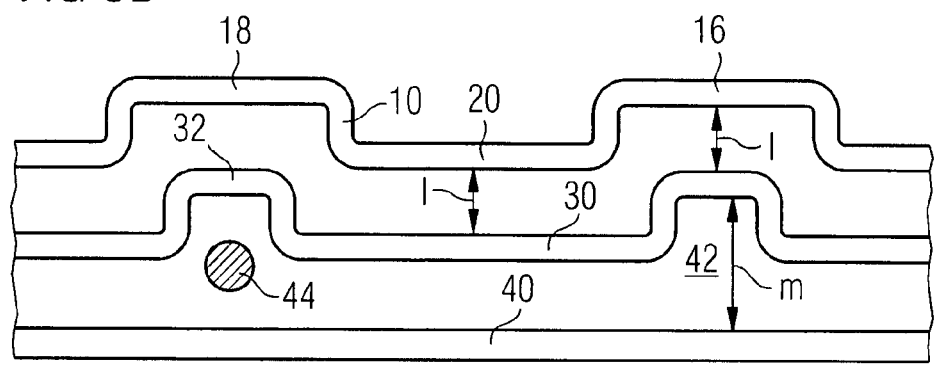
Figure 5C:
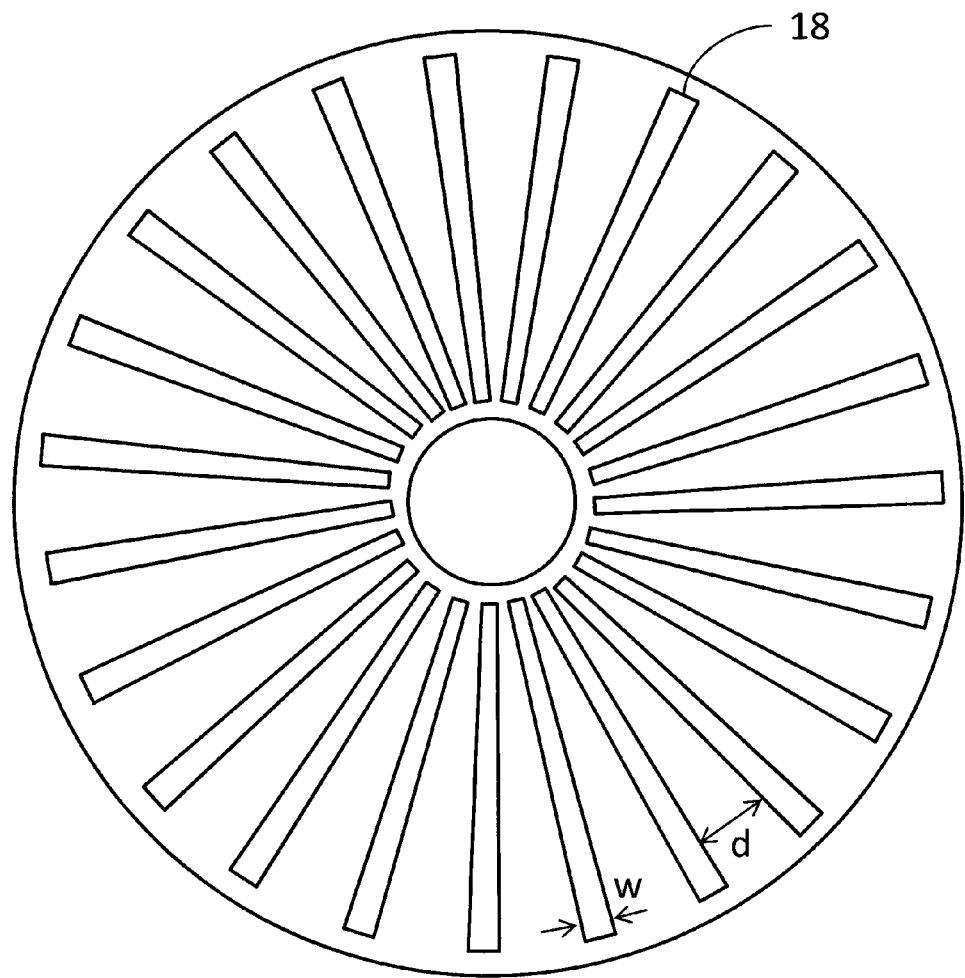

FIG. 5A shows a pattern of recesses or protrusions on the surface of an end cap for an OVC, according to another embodiment of the present invention; and FIG. 5B shows an example of a cryogenic housing according to the present invention, comprising a cryogen vessel, a thermal shield and an OVC vessel, wherein the thermal shield and OVC vessel have nested indentations or protrusions; and FIG. 5C shows a plan view of the end cap shown in FIG. 5A.

Conventional end caps are typically formed of relatively thick material, such as 5-20 mm thick. Such material is chosen to be mechanically strong enough to withstand atmospheric pressure on the OVC, and rigid enough, by virtue of its weight and thickness, to resist resonant vibration. As discussed above, while this approach has been effective, it has resulted in relatively heavy and expensive OVC vessels. The present invention provides annular enclosures wherein the material of the annular enclosure is formed into an arrangement of recesses and protrusions, in order to reduce the tendency of the enclosure to vibrate.

The invention seeks to inhibit the natural tendency of components with simple geometry and symmetry to resonate and cause noise and/or vibration problems. In certain embodiments of the present invention, the material of the end caps of the OVC for structures such as a solenoidal magnet for an MRI system is formed into geometric features which are themselves asymmetric and are arranged asymmetrically relative to each other.

A particular advantage of the present invention lies in that it allows, indeed positively encourages, the use of thinner, lighter materials for the end caps of the OVC vessel. The use of such thinner materials enables supplementary damping and anti-vibration techniques, known in themselves, to be effectively applied to restrain vibration in the end caps of OVC chambers. Such techniques include constrained layer damping, and the application of layers of sound-deadening material.

The thick end caps traditionally used are unaffected by such techniques, whereas the reduction in the thickness of the material of the end caps, enabled by the present invention, enables the effective use of these established techniques.

In particular, the present invention seeks to disturb the simple geometry of known end caps. The techniques of the present invention may also be applied to other components, such as the cylindrical OVC outer or inner shell, and thermal shield components.

Figure 1:
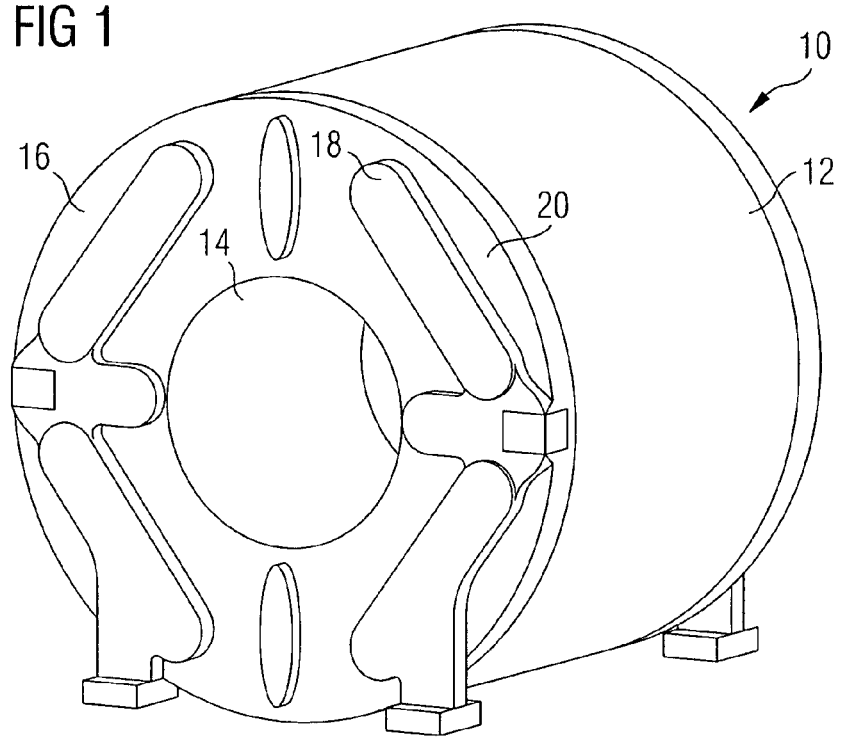
FIG. 1 shows an example of an OVC vessel according to the present invention, suitable for accommodating a solenoidal magnet for an MRI imaging system, according to an embodiment of the present invention.

FIG. 1 shows an example of an end cap formed according to an embodiment of the present invention, in place forming part of an OVC chamber for a magnet in an MRI system.

As illustrated in FIG. 1, the OVC 10 is an annular enclosure and accordingly comprises a smooth cylindrical outer shell 12 and a smooth cylindrical inner shell 14, joined by annular end caps 16. As shown in FIG. 1, the end caps 16 are not flat or smoothly contoured, as were the end caps of the prior art. Rather, the material of the end caps of the annular enclosure is deformed into an arrangement of recesses or protrusions 18 as compared to a reference surface 20. The recesses or protrusions 18 are arranged such that resonance is inhibited in the material of the end caps.

The recesses or protrusions 18 formed in the material of the OVC provide recesses which may be used to accommodate sound-deadening material without adding to the length of the resultant OVC as compared to a system with thick material used for the end caps.

The recesses or protrusions 18 provide mechanical strength, allowing the end caps 16 to be constructed of material which is significantly thinner than used in the prior art. For example, prior art flat end caps were typically of thickness 20-30 mm. Dishing of the end caps of the prior art allowed thinner material to be used. The use of recesses or protrusions according to the present invention allows still thinner material, such as 1-2 mm thick to be used for the end caps.

Beneficially, the recesses or protrusions may be arranged to accommodate certain features of the magnet or other equipment accommodated in the OVC, such as internal suspension features, external displays, controls or features of a patient bed.

Figure 2:
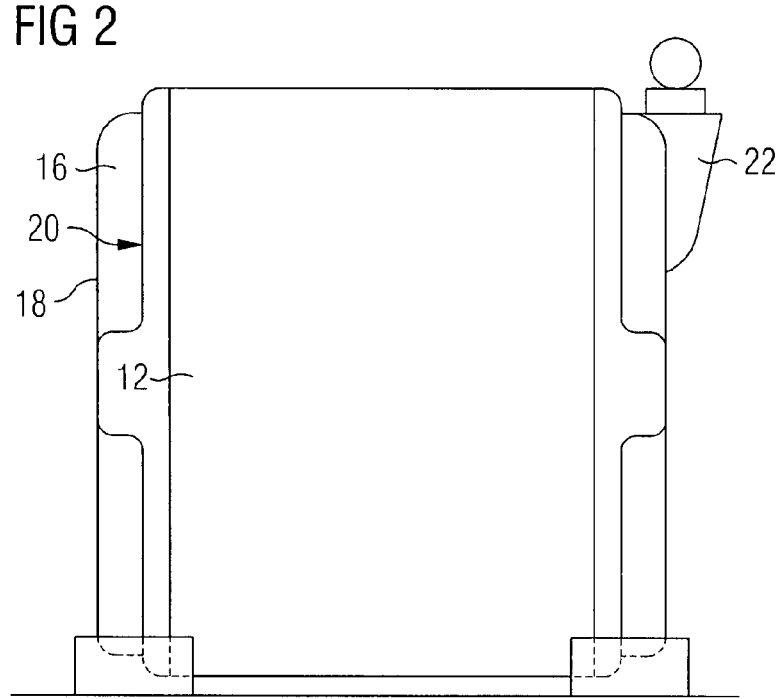
FIG. 2 shows a side view of an OVC vessel according to the present invention, suitable for accommodating a solenoidal magnet for an MRI imaging system, similar to that shown in FIG. 1, adapted to accommodate ancillary equipment on one of the end caps.

FIG. 2 shows further features of an OVC according to an embodiment of the present invention, similar to the embodiment illustrated in FIG. 1. According to this embodiment, features 22 may be provided, by suitable formation of the material of the end cap 16, as an aspect of the recesses or protrusions 18, which allow the location of ancillary equipment on the end cap 16. In a preferred embodiment, ancillary equipment which has hitherto been located on the outer shell 12 may be mounted on the end cap 16. This allows the outer shell 12 to remain smooth, and improves the aesthetic appearance of the resulting OVC. It also enables such ancillary equipment to be located in position which is more accessible for servicing. A further advantageous effect is to minimise axial length of the bore 14 of the system, which results in increased patient comfort and reduction in claustrophobia in patients.

Preferably, the recesses or protrusions 18 of end caps 16 are not rotationally symmetrical, as were many end caps of the prior art. Alternatively, the number of recesses or protrusions 18 is a prime number. More preferably, or alternatively, the recesses or protrusions 18 are arranged in a manner which is asymmetric in all axes. More preferably, the recesses or protrusions are themselves each shaped so as to be symmetric in all axes.

Figure 3:
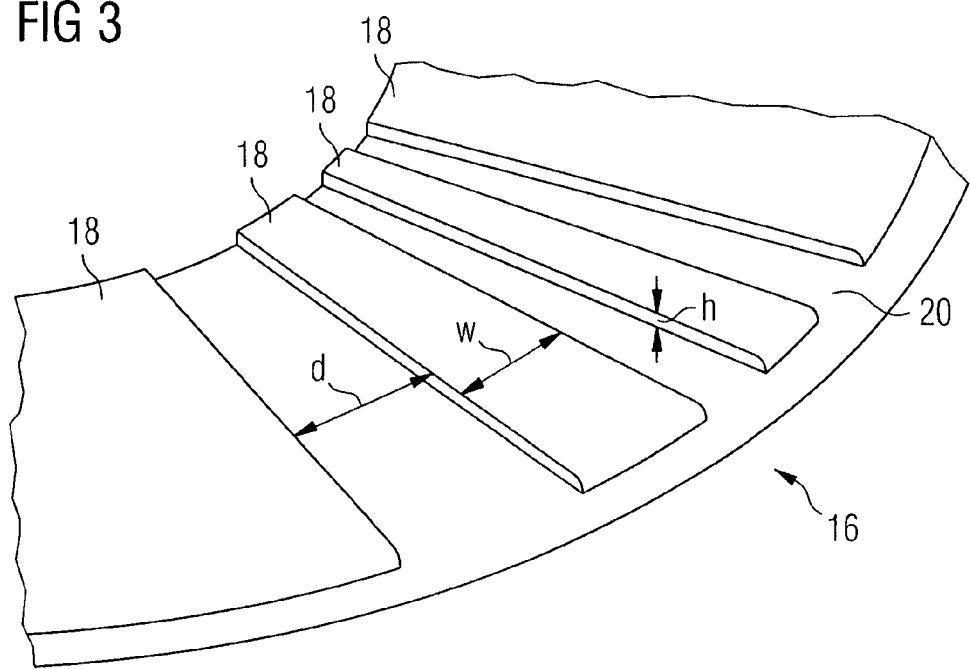
FIG. 3 shows a pattern of recesses or protrusions on the surface of an end cap for an OVC, according to an embodiment of the present invention.
Figure 3A:
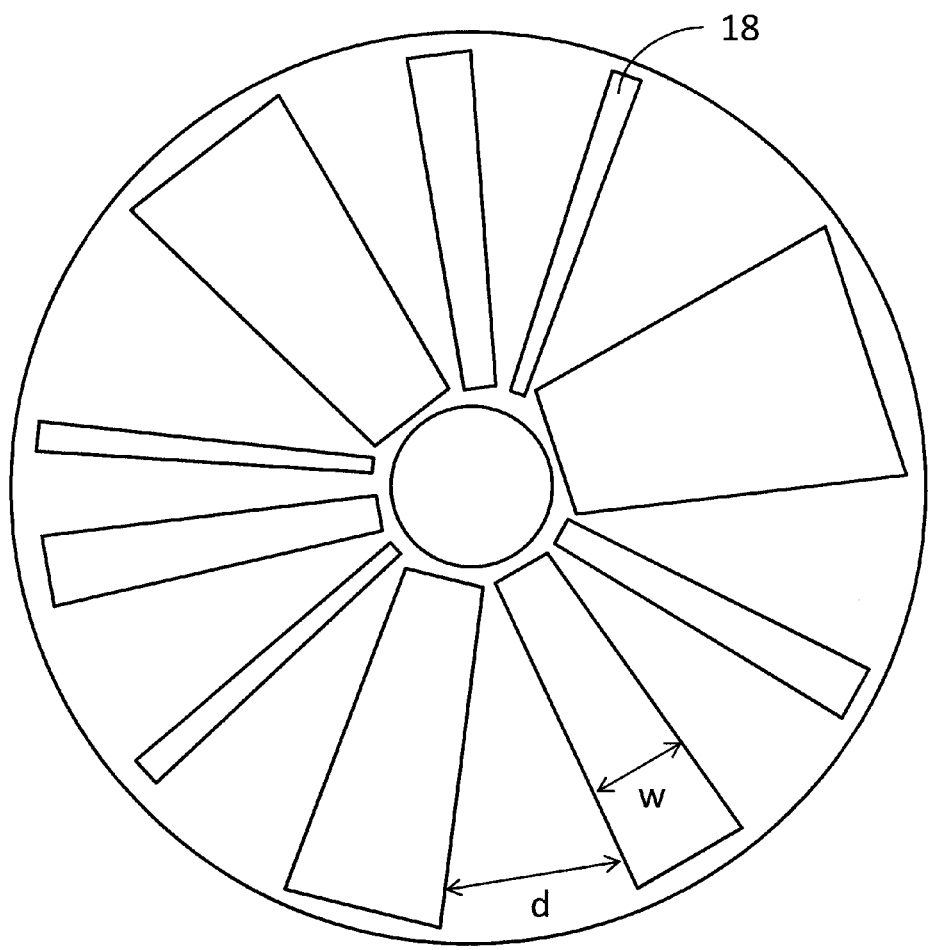
FIG. 3A shows a plan view of the end cap shown in FIG. 3.

FIG. 3 shows a close-up view of an end cap according to another embodiment of the present invention. As illustrated, recesses or protrusions 18 are provided as asymmetric stiffening features and are formed by suitable formation of the material of the end cap 16. The recesses or protrusions are, more particularly, of variable width w. According to features of this embodiment, the protrusions 18 have differing widths w and spacing d. The heights h of the protrusions may differ. According to features of this embodiment, the protrusions are arranged asymmetrically around the end caps. The asymmetry preferably applies to more than one of the following features: heights h, widths w, spacing d. FIG. 3A shows a plan view of the entire end cap shown in FIG. 3. The figures are merely illustrative, and are not drawn to scale.

As may be clearly observed in FIG. 3, recesses are provided between the protrusions 18. These recesses may be employed for the installation of vibration damping material, known in itself. Similarly, on the underside of the end cap (not visible in the drawing), interior cavities of the protrusions 18 provide recesses suitable for the installation of vibration damping material, known in itself. Similarly, the protrusions 18 may be replaced by recesses, in which case vibration damping material may be provided within the recesses themselves, and in cavities formed on the underside of the end cap, between protrusions formed by the material deformed by cavities on the other surface. Alternatively, the recesses on either surface of the end cap may be used to house cable runs or other ancillary equipment.

Figure 4:
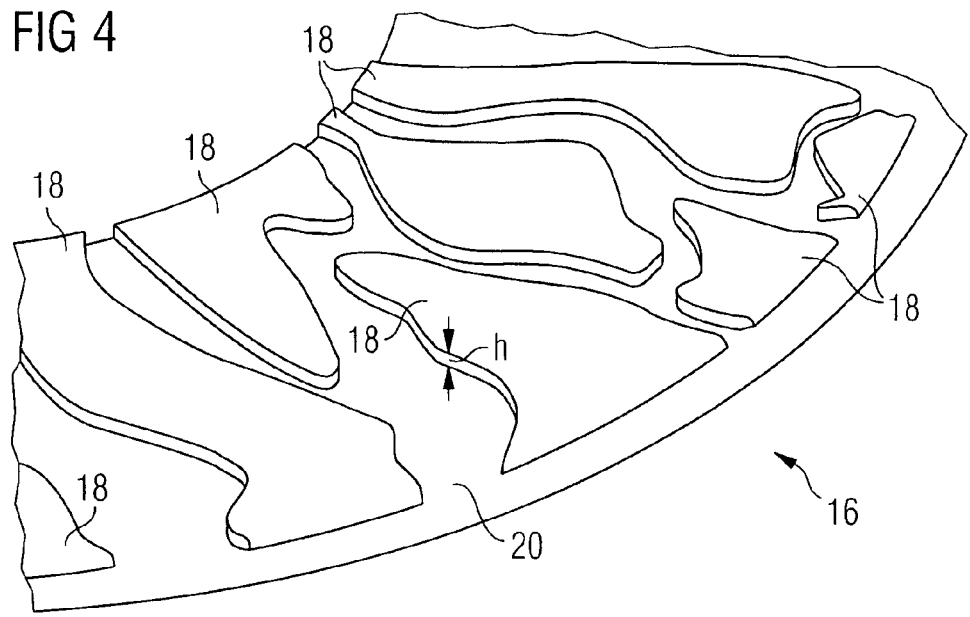
FIG. 4 shows a pattern of recesses or protrusions on the surface of an end cap for an OVC, according to another embodiment of the present invention.

FIG. 4 illustrates a development of the embodiment of FIG. 3. In the embodiment of FIG. 4, the protrusions or recesses 18 are no longer of regular shape. Pseudo-randomly shaped protrusions or recesses 18 are formed on the surface of the end cap 16. The height h of the protrusions may vary, again in a pseudo-random manner. With this embodiment of the present invention, it is simple to provide asymmetry in all axes with regard to any or all of the size, shape, position and spacing of the protrusions 18. Such asymmetry is effective in preventing or at least reducing the effects of resonance of the end cap.

FIG. 5A shows another, simplified, embodiment of the present invention. The protrusions 18 here all have the same width w, height h and spacing d. The required asymmetry is provided by ensuring that the end cap carries a prime number of stiffening features formed by suitable formation of the material of the annular enclosure. In this way, resonance around the end cap is reduced. As discussed with reference to other embodiments, the recesses between protrusions 18 may be used to accommodate ancillary equipment, or cable runs. Alternatively, sound deadening material may be placed in the recesses. Equally, sound deadening material may be placed in the internal recesses within the protrusions on the underside of the end cap (not visible in the drawing). FIG. 5C shows a plan view of the entire end cap shown in FIG. 5A. In this exemplary embodiment, the end cap includes 23 protrusions 18 that all have the same width w, height h and spacing d. The figures are merely illustrative, and are not drawn to scale.

FIG. 5B shows a particularly advantageous arrangement of the end caps of the present invention when applied to housing cryogenically cooled equipment such as superconducting magnets for MRI systems. As is well known in the art, cryostat vessels for such applications typically comprise a liquid cryogen vessel 40, containing liquid cryogen, an outer vacuum chamber 10 surrounding the liquid cryogen vessel, the space between the liquid cryogen vessel and the outer vacuum container being evacuated. A thermal shield 30 is typically also provided, to protect the liquid cryogen vessel from heat radiated from the outer vacuum chamber 10. As illustrated in FIG. 5B, the outer vacuum chamber 10 has an end cap 16 which is profiled according to the invention, for example as illustrated in FIG. 5A. Protrusions 18 provide rigidity and resistance to mechanical resonance. Advantageously, the thermal shield 30 is provided with protrusions 32, complementary to the inner surface of protrusions 18 of the end cap 16. The thermal shield 30 is arranged at a certain minimum distance I from the inner surface of the end cap 10. The respective protrusions of the end cap and the thermal shield enable the respective protrusions 32 of the thermal shield 30 to be located at approximately the certain minimum distance I from the inner surface of the protrusions 18 of the end cap 10. Since the distance I is maintained over the surface of the end cap, the performance of the thermal shield is not significantly affected by the presence of the protrusions. On the other hand, the liquid cryogen vessel 40 is preferably not provided with protrusions. In certain regions 42, corresponding to the inner surface of each protrusion 32 of the thermal shield, an increased separation m is provided between the outer surface of the liquid cryogen vessel and the inner surface of the thermal shield. Advantageously, and according to certain embodiments of the present invention, this increased separation m may be used to accommodate internal features such as suspension member 44 shown in FIG. 5B. By taking careful advantage of such arrangements, the overall length of a piece of equipment may be reduced.

For example, using conventional planar thermal shields and end pieces, the thermal shield 30 would have to be placed at the increased separation m from the liquid cryogen vessel, in order to accommodate the suspension member 44. In order to maintain the separation I between the thermal shield and the OVC, the OVC end cap would need to be spaced from the thermal shield by a distance I, corresponding to the position of the inner surface of protrusions 18 shown in FIG. 5B. Furthermore, the end cap would need to be much thicker: up to 30 mm instead of 1-3 mm, to provide the required strength and stiffness. The overall length of the equipment would be increased, possibly by 50 mm or more. The MRI imaging industry is constantly searching for ways to reduce the overall length of magnet systems. The present invention provides a possible saving of 50 mm or more in length, as well as reducing the cost and weight of the OVC.

Formation of the end caps 16 according to the present invention may be performed by any method appropriate for the material used. Preferably, non-magnetic materials are used, since these will not be affected by magnetic pulses produced by the gradient coils. For example, composite materials such as fibreglass- or carbon fibre-reinforced plastic may be formed over a mould having the required pattern of recesses. Such composite materials may include a constrained layer to assist in damping mechanical vibrations. Additional vibration damping materials may be applied to the surface of the composite material, filling in some of the recesses formed in the material of the end cap, during lay-up of the composite material. Aluminium or titanium end caps may be produced by vacuum moulding or "super plastic forming" at a temperature of about 400° C. This method is preferred to pressing, since no residual stresses are left in the material, a more uniform thickness of the material is provided, and very deep mouldings are possible. Pressing may be used, if such drawbacks do not cause problems in the particular design used.

A further advantage of the present invention lies in that assembly of the resultant vessel is simplified. It is much easier to weld thinner panels together, such as the 1-3 mm thick panels of the present invention, rather than the 6-30 mm thick panels of the prior art.

Particular features of the present invention include the following. The end caps may be formed from significantly thinner material than previously used. For example, prior art OVC flat ends are typically formed from material 25-30 mm thick; prior art dished ends are typically formed from material 6-8 mm, while the end caps provided by the present invention are typically formed from material 1-3 mm thick. Additional mechanical strength of the end caps is provided by use of recesses or protrusions within the material of the end caps. Such recesses or protrusions, and their arrangement, are preferably asymmetric in all axes thereby inhibiting resonant frequency modes. Alternatively, or in addition, the number of recesses or protrusions in an end cap is a prime number, thereby inhibiting resonance of the end caps. The recesses or protrusions may also serve to provide recesses to accommodate sound deadening material without excessive system length increase. The recesses or protrusions may serve to provide recesses to accommodate auxiliary imaging system components without excessive system length increase. The recesses or protrusions may serve to provide recesses to accommodate internal cryostat components, such as suspension components, without excessive system length increase. In some embodiments, 'nested' recesses or protrusions may be provided in adjacent components, such as OVC and shield ends, to minimise overall system length. The recesses or protrusions formed within the end caps have potential uses for minimising system length. The recesses or protrusions may be formed by pressing, moulding or super-plastic forming processes applicable to the material.

While the above description has described the present invention with particular reference to the end caps for OVC vessels, the present invention may find other applications. For example, other parts of the OVC vessel may benefit from application of the invention. The inner 14 or outer 12 cylindrical wall may be provided with a prime number of recesses or protrusions such as described in any of the above embodiments, so as to reduce any tendency to resonate. Similarly, cylindrical walls or end caps of thermal shield 30 described above may benefit from application of the recesses or protrusions of the present invention.

The walls or end caps of the OVC vessel or thermal shield of the present invention may be formed of any suitable material, including (but not limited to) stainless steel, carbon steel, composites, aluminium or titanium, or alloys thereof.

The invention claimed is:
1. An annular enclosure comprising:
a cylindrical outer shell;
a cylindrical inner shell;
annular end caps which join said outer shell to said inner shell, forming said enclosure; and
a non-random pattern of (a) recesses having a bottom surface made of a material of the annular enclosure and (b) protrusions having a top surface made of the material of the annular enclosure and a wall, made of the material of the annular enclosure, descending from the top surface to the bottom surface, wherein the recesses are located between the protrusions;

wherein said pattern is asymmetrical in all axes, whereby the tendency of the material of the annular enclosure to mechanically resonate is reduced.

2. The annular enclosure according to claim 1, wherein the pattern of recesses and protrusions is formed in at least one of the end caps.

3. The annular enclosure according to claim 1, wherein at least one of the following features is asymmetrical in all axes: heights h, widths w, spacing d of the recesses and protrusions that form said pattern.

4. The annular enclosure according to claim 1, wherein the shapes of the recesses and protrusions are asymmetrical in all axes.

5. The annular enclosure according to claim 4, wherein the recesses and protrusions are pseudo-randomly shaped.

6. The annular enclosure according to claim 2, wherein the at least one end cap has a thickness of 1-3 mm.

7. The annular enclosure according to claim 1, wherein the recesses accommodate a constrained layer of vibration-damping material.

8. The annular enclosure according to claim 1, wherein the recesses accommodate cable runs or other ancillary equipment.

9. A cryostat for housing a solenoidal superconducting magnet, comprising:
a liquid cryogen vessel for containing liquid cryogen;
an outer vacuum chamber surrounding the liquid cryogen vessel; and
a thermal shield between the liquid cryogen vessel and the outer vacuum chamber, wherein,
each of the outer vacuum chamber and the thermal shield comprises an annular enclosure according to claim 1;
the outer vacuum chamber has an end cap comprising protrusions; and
the thermal shield has an end cap comprising protrusions that are complementary to an inner surface of protrusions of the outer vacuum chamber.

10. The cryostat according to claim 9, wherein, in at least one certain region corresponding to the inner surface of a protrusion of the thermal shield, an internal feature such as a suspension member is located.

11. A cryostat for housing a solenoidal superconducting magnet, said cryostat comprising:
a liquid cryogen vessel for containing liquid cryogen; and
an outer vacuum chamber surrounding the liquid cryogen vessel; wherein,
the outer vacuum chamber comprises an annular enclosure according to claim 1; and
said annular enclosure has an end cap comprising a feature as an aspect of the recesses or protrusions, which feature allows the location of ancillary equipment on the end cap.

12. The annular enclosure, or a cryostat, according to claim 1, wherein the pattern of recesses and protrusions is produced by vacuum moulding or "super plastic forming" at a temperature of about 400° C.

13. The annular enclosure according to claim 1, wherein at least one of said end caps, said cylindrical outer shell, or said cylindrical inner shell, is formed of a composite material formed over a mould having a pattern of recesses and protrusions that form said pattern of recesses and protrusions in said annular enclosure.

14. The annular enclosure according to claim 13, wherein the composite material includes a constrained layer to assist in damping mechanical vibrations.

15. The annular enclosure according to claim 1, wherein the pattern of recesses and protrusions is formed of one of aluminum, titanium, or an alloy of aluminum and titanium.

16. The annular enclosure or cryostat, according to claim 1, wherein the pattern of recesses and protrusions is formed of one of carbon steel, stainless steel, or a composite material.

17. A cryostat for housing a solenoidal superconducting magnet, the cryostat comprising:
a liquid cryogen vessel for containing liquid cryogen; and
an outer vacuum chamber surrounding the liquid cryogen vessel;
wherein the outer vacuum chamber comprises an annular enclosure comprising:
a cylindrical outer shell;
a cylindrical inner shell;
annular end caps which join said outer shell to said inner shell, forming said enclosure; and
a non-random pattern of (a) recesses having a bottom surface made of a material of the annular enclosure and (b) protrusions having a top surface made of the material of the annular enclosure and a wall, made of the material of the annular enclosure, descending from the top surface to the bottom surface, wherein the recesses are located between the protrusions;
wherein said pattern is asymmetrical in all axes, whereby the tendency of the material of the annular enclosure to mechanically resonate is reduced.

18. The cryostat according to claim 17, the cryostat further comprising a thermal shield between the liquid cryogen vessel and the outer vacuum chamber, wherein:
at least one of the end caps of the outer vacuum chamber comprises protrusions; and
the thermal shield has an end cap comprising protrusions that are complementary to an inner surface of the protrusions of the outer vacuum chamber.

19. The annular enclosure according to claim 1, wherein the recesses and protrusions are irregularly shaped, and exhibit variation in the shapes of the recesses and protrusions.

* * * * *